US011239410B2

(12) United States Patent
Katoh et al.

(10) Patent No.: US 11,239,410 B2
(45) Date of Patent: *Feb. 1, 2022

(54) PIEZOELECTRIC COMPOSITION AND PIEZOELECTRIC ELEMENT

(71) Applicant: TDK CORPORATION, Tokyo (JP)

(72) Inventors: Hiroki Katoh, Tokyo (JP); Yuiko Hirose, Tokyo (JP); Masakazu Hirose, Tokyo (JP)

(73) Assignee: TDK CORPORATION, Tokyo (JP)

( * ) Notice: Subject to any disclaimer, the term of this patent is extended or adjusted under 35 U.S.C. 154(b) by 240 days.

This patent is subject to a terminal disclaimer.

(21) Appl. No.: 16/497,090

(22) PCT Filed: Mar. 20, 2018

(86) PCT No.: PCT/JP2018/011039
§ 371 (c)(1),
(2) Date: Sep. 24, 2019

(87) PCT Pub. No.: WO2018/180772
PCT Pub. Date: Oct. 4, 2018

(65) Prior Publication Data
US 2020/0295252 A1    Sep. 17, 2020

(30) Foreign Application Priority Data

Mar. 28, 2017 (JP) .............................. JP2017-062407

(51) Int. Cl.
*H01L 41/187* (2006.01)
*C04B 35/495* (2006.01)
*H01L 41/083* (2006.01)

(52) U.S. Cl.
CPC ........ *H01L 41/1873* (2013.01); *C04B 35/495* (2013.01); *H01L 41/083* (2013.01); *C04B 2235/3255* (2013.01); *C04B 2235/3267* (2013.01); *C04B 2235/3281* (2013.01); *C04B 2235/768* (2013.01)

(58) Field of Classification Search
CPC ............... H01L 41/1873; C04B 35/495; C04B 2235/768; C04B 2235/3281; C04B 2235/3255; C04B 2235/3267
See application file for complete search history.

(56) References Cited

U.S. PATENT DOCUMENTS

| 6,387,295 B1* | 5/2002 | Saito ..................... C04B 35/495 |
| | | 252/62.9 R |
| 6,884,364 B2* | 4/2005 | Sato ....................... C04B 35/495 |
| | | 252/62.9 R |
| 8,471,442 B2* | 6/2013 | Hatano ............... H01L 41/1873 |
| | | 310/358 |
| 9,590,168 B2* | 3/2017 | Kobayashi ............ C04B 35/495 |
| 11,005,028 B2* | 5/2021 | Katoh ................. H01L 41/1873 |
| 2004/0127344 A1 | 7/2004 | Sato et al. |
| 2018/0301618 A1* | 10/2018 | Shibata ................... H01L 41/18 |

FOREIGN PATENT DOCUMENTS

| CN | 104529446 | * | 4/2015 |
| DE | 102006015042 A1 | | 10/2007 |
| EP | 2113952 A2 | | 11/2009 |
| JP | 2000-313664 A | | 11/2000 |
| JP | 4398635 B2 | | 1/2010 |
| JP | 2017-076730 A | | 4/2017 |
| WO | WO 2017/06513 | * | 4/2017 |

OTHER PUBLICATIONS

Translation for CN 104529446, Apr. 22, 15.*
Matsubara et al., "Synthesis and Characterization of (K0.5Na0.5)(Nb0.7Ta0.3)O3 Piezoelectric Ceramics Sintered with Sintering Aid K5.4Cu1.3Ta10O29," Japanese Journal of Applied Physics, Sep. 8, 2005, vol. 44, No. 9A, pp. 6618-6623.
Lim et al., "Effect of K/Na ratio on piezoelectric properties of modified-(K1-xNax)NbO3 'Hard' lead-free piezoelectrics," Ceramics International, Oct. 29, 2011, vol. 38, pp. 2605-2608.
Jun. 5, 2018 International Search Report issued in International Patent Application No. PCT/JP2018/011039.
Oct. 1, 2019 International Preliminary Report on Patentability issued in International Patent Application No. PCT/JP2018/011039.

* cited by examiner

*Primary Examiner* — C Melissa Koslow
(74) *Attorney, Agent, or Firm* — Oliff PLC (57) ABSTRACT

A piezoelectric composition including copper and a complex oxide having a perovskite structure represented by a general formula $ABO_3$, in which an A site element in the $ABO_3$ is potassium or potassium and sodium, a B site element in the $ABO_3$ is niobium or niobium and tantalum, the copper is included in n mol % in terms of a copper element with respect to 1 mol of the complex oxide, and n satisfies $0.100 \leq n \leq 1.000$.

14 Claims, 3 Drawing Sheets

PIEZOELECTRIC COMPOSITION AND PIEZOELECTRIC ELEMENT

BACKGROUND OF THE INVENTION

The present invention relates to a piezoelectric composition and a piezoelectric element having thereof.

The piezoelectric composition has, based on a spontaneous polarization due to bias of an electric charge in crystals, an effect (a piezoelectric effect) of generating electric charge on the surface due to receiving an external stress and an effect (a converse piezoelectric effect) of generating distortion due to an application of an external electric field.

Piezoelectric elements to which such piezoelectric compositions, capable of mutually converting mechanical displacement and electrical displacement, are applied are widely used in various fields. For example, an actuator as the piezoelectric element utilizing the converse piezoelectric effect, in relative to an applied voltage, can provide a minute displacement with a high precision and has a fast response speed. Therefore, the actuator can be used for driving e.g. an optical system component, an HDD head, an ink jet printer head, and a fuel injection valve.

It is also used as a sensor for reading a minute force or deformation amount using the piezoelectric effect. Furthermore, since the piezoelectric composition has an excellent responsiveness, resonance can also be caused by exciting the piezoelectric composition itself or an elastic body that is connected with the piezoelectric composition by applying an AC electric field. Therefore, it is also used as a piezoelectric transformer, an ultrasonic motor, etc.

In general, the piezoelectric composition is composed of a polycrystalline substance and is obtained by subjecting a poling processing to the fired ferroelectric composition. In the ferroelectric composition after firing, the direction of spontaneous polarization in each crystal is random. And the ferroelectric composition as a whole has no bias of the electric charge and does not exhibit the piezoelectric effect or the converse piezoelectric effect. Therefore, by applying a DC electric field higher than the coercive electric field to the fired ferroelectric composition, an operation called poling processing in which the direction of spontaneous polarization is aligned in a certain direction is performed. The ferroelectric composition after the poling processing can exhibit properties as the piezoelectric composition.

As the piezoelectric composition, a lead based piezoelectric composition composed of lead zirconate ($PbZrO_3$) and lead titanate ($PbTiO_3$) is frequently used. However, the lead-based piezoelectric composition contains about 60 to 70 wt % of lead oxide (PbO) having a low melting point, and lead oxide easily volatilizes during firing. Therefore, from a viewpoint of environmental burden, development of a lead-free piezoelectric composition is an extremely important task.

Bismuth layered ferroelectrics and the like are known as the lead-free piezoelectric composition. However, it is necessary to align the spontaneous polarization by utilizing the shear stress applied by the hot forging method due to a large crystal anisotropy of the bismuth layered ferroelectric, and that there is a problem in terms of productivity.

On the other hand, a research on an alkali metal niobate based compound has recently progressed as a new eco-friendly piezoelectric composition. For example, the following Patent Document 1 discloses a piezoelectric composition in which copper oxide is added to the compound of the alkali metal niobate based compound.

Patent Document 1: JP Patent No. 4398635

BRIEF SUMMARY OF INVENTION

In order to realize a high performance and a downsizing of an apparatus in which the piezoelectric element including the piezoelectric composition is mounted, it is necessary to reduce the size of the piezoelectric element while maintaining the performances of the piezoelectric element. In this case, it is also necessary to reduce the size of the piezoelectric composition, however, the mechanical strength of the piezoelectric composition decreases as the size of the piezoelectric composition reduces. If the mechanical strength is lowered, defective products may be generated during processing the piezoelectric composition. Thus, the piezoelectric composition is required to have a preferable mechanical strength.

However, according to the alkali metal niobate based compound disclosed in the above Patent Document 1, there were problems that the alkali metal elements volatilize during firing, and voids, defects, etc. are likely to generate inside the piezoelectric composition after firing, and the mechanical strength is low. However, the mechanical strength is not evaluated in Patent Document 1.

The invention has been made in view of such circumstances, and an object of the invention is to provide a piezoelectric composition having a preferable mechanical strength, and a piezoelectric element including the piezoelectric composition.

BRIEF SUMMARY OF INVENTION

In order to achieve the above object, a piezoelectric composition of the invention is

[1] a piezoelectric composition including copper and a complex oxide having a perovskite structure represented by a general formula $ABO_3$, in which an A site element in the $ABO_3$ is potassium or potassium and sodium, a B site element in the $ABO_3$ is niobium or niobium and tantalum, the copper is included in n mol % in terms of a copper element with respect to 1 mol of the complex oxide, and n satisfies $0.100 \leq n \leq 1.000$.

[2] The piezoelectric composition according to [1], in which m satisfies $0.970 \leq m \leq 0.999$ when m is the total number of atoms of the A site elements with respect to the total number of atoms of the B site element in the $ABO_3$.

[3] The piezoelectric composition according to [1] or [2], in which the $ABO_3$ is represented by a compositional formula $(K_xNa_{1-x})_m(Ta_yNb_{1-y})O_3$, and y in the compositional formula satisfies $0 \leq y \leq 0.300$.

[4] The piezoelectric composition according to [2] or [3], in which m in the compositional formula satisfies $0.991 \leq m \leq 0.999$.

[5] The piezoelectric composition according to any one of [1] to [4], in which the $ABO_3$ is represented by a compositional formula $(K_xNa_{1-x})_mNbO_3$, and x in the compositional formula satisfies $0.400 \leq x \leq 1.000$.

[6] The piezoelectric composition according to any one of [1] to [5], in which the manganese is included in z mol % in terms of a manganese element with respect to 1 mol of the complex oxide, and z satisfies $0.000 \leq z \leq 1.500$.

[7] A piezoelectric element including the piezoelectric composition according to any one of [1] to [6].

It is possible to provide a piezoelectric composition having a preferable mechanical strength and a piezoelectric element including the piezoelectric composition, since the piezoelectric composition according to the invention has the above properties.

Hereinafter, the invention will be described in detail based on specific embodiments in the following order.
1. Piezoelectric element
　1.1 Piezoelectric composition
2. Method of producing piezoelectric element
3. Effects in the embodiment
4. Modified embodiments 1. Piezoelectric Element First, a piezoelectric element to which the piezoelectric composition according to the embodiment is applied will be described. The piezoelectric element is not particularly limited as long as it is an element to which the piezoelectric composition according to the embodiment can be applied. In the embodiment, a piezoelectric transformer, a thin film sensor, and a piezoelectric ultrasonic motor, etc. are exemplified.

Figure 1:
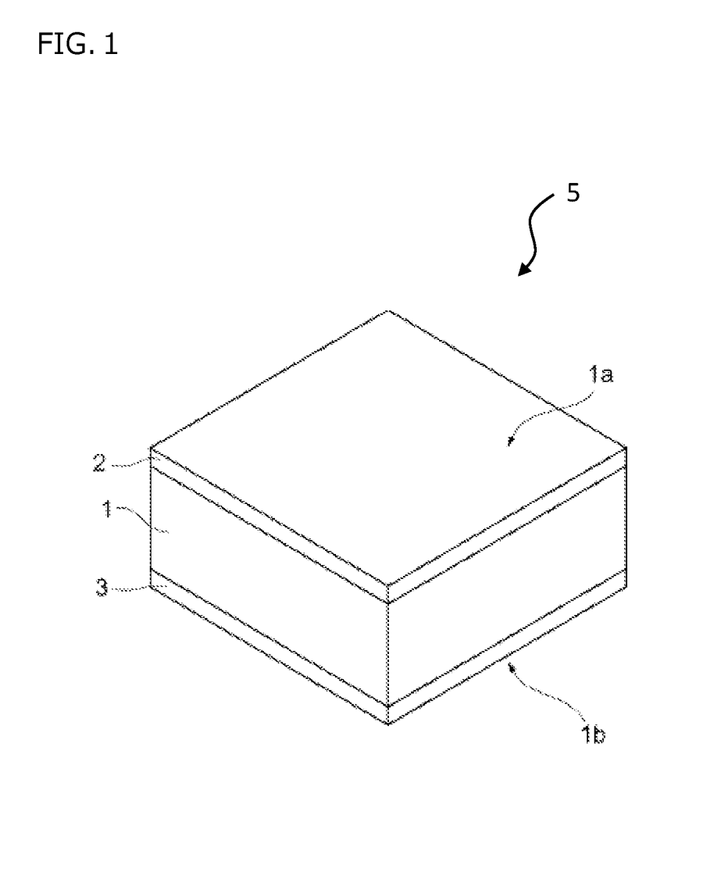
FIG. 1 is a schematic perspective view of an example of a piezoelectric element according to the embodiment.

The piezoelectric element 5 shown in FIG. 1 includes a plate-shaped piezoelectric part 1 and a pair of electrodes 2 and 3 formed on a pair of opposing surfaces 1a and 1b, which are both main surfaces of the piezoelectric part 1. The piezoelectric part 1 includes the piezoelectric composition according to the embodiment. Details of the piezoelectric composition will be described later. The conductive material contained in the electrodes 2, 3 is not particularly limited, and can be arbitrarily set according to desired properties, use, etc. Gold (Au), silver (Ag), palladium (Pd), etc. are exemplified in the embodiment.

Although the piezoelectric part 1 has a rectangular parallelepiped shape in FIG. 1, the shape of the piezoelectric part 1 is not particularly limited and can be arbitrarily set according to desired properties, use, etc. In addition, the size of the piezoelectric part 1 is not particularly limited, and can be arbitrarily set according to desired properties, use, etc.

The piezoelectric part 1 is poled in a predetermined direction. For example, in the piezoelectric element 5 shown in FIG. 1, it is polarized in the thickness direction of the piezoelectric part 1, namely, it is polarized in the direction in which the electrodes 2 and 3 are opposed. For instance, an external power supply (not shown) is electrically connected to the electrodes 2, 3, via wires or the like (not shown), and a predetermined voltage is applied to the piezoelectric part 1 via the electrodes 2, 3. When voltage is applied, an electrical displacement is converted into a mechanical displacement by the converse piezoelectric effect in the piezoelectric part 1, and the piezoelectric part 1 can longitudinally vibrate in a longitudinal direction and laterally vibrate in a lateral direction.

(1.1 Piezoelectric Composition)

The piezoelectric composition according to the embodiment includes the complex oxide having a perovskite structure represented by a general formula $ABO_3$ as a main component. According to the embodiment, the main component is 90 mol % or more with respect to 100 mol % of the piezoelectric composition.

In the perovskite structure, an element having a large ion radius such as alkali metal elements, alkaline earth metal elements tend to occupy an A site of $ABO_3$ while an element having a small ion radius, such as transition metal elements, tend to occupy a B site of $ABO_3$. Then, the $BO_6$ oxygen octahedra including the B site element and oxygen constitute a three-dimensional network in which the apexes of the $BO_6$ oxygen octahedra are shared, and the perovskite structure is formed by filling the A site element in the interstitial site of the network.

In the embodiment, the general formula $ABO_3$ can be represented by a compositional formula $(K_xNa_{1-x})_m(Ta_yNb_{1-y})O_3$. That is, the A site element is potassium (K) and sodium (Na), and the B site element is niobium (Nb) and tantalum (Ta).

In the above compositional formula, "x" indicates an existence ratio of K at the A site and satisfies $0 \leq x \leq 1.000$. In the embodiment, it preferably satisfies $0.400 \leq x \leq 1.000$, and more preferably satisfies $0.810 \leq x \leq 1.000$. The A site element is only K when "x" is 1.000.

In the embodiment, Qm can be increased while maintaining preferable mechanical strength by increasing the ratio of K at the A site.

In the above compositional formula, "y" indicates an existence ratio of Ta at the B site and $0 \leq y < 1.000$. In the embodiment, it preferably satisfies $0 < y \leq 0.300$, and more preferably satisfies $0.030 \leq y \leq 0.100$. The B site element is only Nb when "y" is 1.000.

In the embodiment, a preferable mechanical strength and Qm can be obtained even when the B site element is only Nb, however, Qm can be further increased and the dielectric constant c can also be improved while maintaining a preferable mechanical strength by substituting a part of Nb with Ta within the above-mentioned range.

"m" in the above compositional formula indicates a ratio of the total number of A site element with respect to that of B site element, so-called an A/B ratio. That is, it is a ratio of a sum of the number of K atoms and the number of Na atoms with respect to a sum of the number of Ta atoms and the number of Nb atoms. In the embodiment, "m" is preferably $0.970 \leq m \leq 0.999$. Further, "m" is more preferably $0.991 \leq m \leq 0.999$.

In the embodiment, in particular, it is possible to obtain a preferable mechanical strength, when the B site element (Ta, Nb) is in excess of the A site element (K, Na). In addition, the obtained piezoelectric composition shows a high deliquescence when "m" is larger than the above range. Thereby, the strength tends to be remarkably low and the piezoelectric composition cannot endure the processing. On the other hand, when "m" is smaller than the above range, the density of the obtained piezoelectric composition tends to be low and the mechanical strength tends to be low.

Furthermore, by properly adjusting the range of "m", Qm can be further enhanced while maintaining the good mechanical strength.

The piezoelectric composition according to the embodiment includes copper (Cu). When a Cu content in terms of Cu element with respect to 1 mol (100 mol %) of the above complex oxide is n mol %, it is preferably $0.100 \leq n \leq 1.000$, more preferably $0.200 \leq n \leq 1.000$, and furthermore preferably $0.600 \leq n \leq 1.000$.

As long as Cu is included within the above range, there are no restrictions on its existence form. Cu maybe dissolved in the crystal grains constituting the complex oxide, however, Cu may be present in the grain boundaries. It may form a compound with another element, when present in the grain boundary. However, it is preferable that there are many crystal grains having a crystal phase including $(K_xNa_{1-x})_m(Ta_yNb_{1-y})O_3$ and a grain boundary, and it is not preferable that Cu exist as a secondary phase from the above.

By the presence of Cu in grains and/or grain boundaries, the bonding strength between the crystal grains becomes strong, and the mechanical strength of the piezoelectric composition can be enhanced. In addition, the Cu content is related to the above-described "m". Cu is possible to dissolve in the solid solution or remain in the grain boundary by making the Cu content and the range of "m" within the above-described ranges and thus a secondary phase containing Cu is not likely to form. As a result, the bonding strength between crystal grains can be further enhanced. Furthermore, it is possible to suppress deliquescence of the piezoelectric composition.

Moreover, mechanical quality factor Qm can be improved by including Cu. However, if the content of Cu is too large, a leak current due to voltage application at the time of poling processing of the piezoelectric composition may occur, and enough poling may not be performed. In this case, the poling is insufficient, and the piezoelectric properties exhibited by aligning the direction of the spontaneous polarization in a predetermined direction are deteriorated. Therefore, in the embodiment, by setting Cu and "m" within the above ranges, it is possible to suppress the generation of secondary phase which is a major cause of occurrence of the leak current. As a result, an enough poling processing can be performed. Therefore, the effect of Qm improvement can be obtained, and thus Qm can be improved.

Furthermore, the piezoelectric composition according to the embodiment may include manganese (Mn). When the Mn content in terms of Mn element with respect to 1 mol (100 mol %) of the above complex oxide is z mol %, it is preferably $0.000 \leq z \leq 1.500$ and more preferably $0.000 \leq z \leq 0.300$.

As long as Mn is included within the above range, similar to Cu, there are no restrictions on its existence form. Mn may be dissolved in the crystal grains constituting the complex oxide or may be present in the grain boundaries. The bonding between the crystal grains is strengthened by the presence of Mn in grains and/or grain boundaries. Thus, the mechanical strength of the piezoelectric composition can be improved.

The piezoelectric composition according to the embodiment may include the other components besides the above described components. For example, at least one metal element of the transition metal elements (elements of Groups 3 to 11 in the long-period periodic table) other than the above described Nb, Cu, and Mn, the alkaline earth metal elements, the Group 12 elements in the long-period periodic table and the Group 13 elements in the long-period periodic table may be contained. This is because it is possible to improve the other piezoelectric properties besides Qm, especially the electromechanical coupling coefficient (k).

In concrete, the transition metal elements excluding rare earth elements exemplify chromium (Cr), iron (Fe), cobalt (Co), nickel (Ni), tungsten (W), and molybdenum (Mo), etc.

As the rare earth element, yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm) and ytterbium (Yb), etc. are exemplified.

Alkaline earth metal elements exemplify magnesium (Mg) and strontium (Sr), etc. The Group 12 elements exemplify such as zinc (Zn). The Group 13 metal elements exemplify such as aluminum (Al), gallium (Ga), indium (In).

Further, although the piezoelectric composition according to the embodiment may include lead (Pb) as an impurity, the content thereof is preferably 1 wt % or less, and Pb is more preferably not contained at all. From the viewpoint of a low pollution, an environment resistance and an ecology, it is possible to minimize a volatilization of Pb at the time of firing, or it is possible to minimize the release of Pb into the environment after an electronic apparatus mounting the piezoelectric element including the piezoelectric composition of the embodiment is being distributed to the market and being disposed.

The average crystal grain size of the crystal grains constituting the piezoelectric composition according to the embodiment may be controlled from the viewpoint of exhibiting piezoelectric properties and mechanical strength. In the embodiment, it is preferable that the average crystal grain size is, for example, 0.5 μm to 20 μm.

2. Producing Method of Piezoelectric Element

Next, an example of a producing method of the piezoelectric element will be described below.

First, a starting material for the piezoelectric composition is prepared. As a starting material for the complex oxide, compounds including K and compounds including Nb can be used, and if necessary, the compounds including Na and the compounds including Ta can be used. Examples of the compounds including K and the compounds including Na are carbonates, hydrogen carbonate compounds, etc. As the compounds including Nb and the compounds including Ta, such as oxides are exemplified.

A starting material for the copper may be copper alone or a copper included compound. An oxide including copper is preferable in the embodiment. When manganese is included in the piezoelectric composition, a starting material of manganese may be prepared. As the starting material of manganese, similar to copper, manganese alone may be used or a compound including manganese may be used. In the embodiment, an oxide including manganese is preferable.

After weighing the prepared starting materials of the complex oxide at a predetermined ratio, mixing is processed for 5 to 20 hours using such as a ball mill. A wet mixing or a dry mixing may be used for the mixing method. In the case of wet mixing, the mixed powder is dried. Subsequently, the mixed powder or a green compact obtained by compacting the mixed powder is subjected to a heat treatment (calcination) in the air at 750 to 1050° C. for 1 to 20 hours to obtain calcined powder of the complex oxide.

The complex oxide constituting the obtained calcined powder has a perovskite structure represented by the general formula $KNbO_3$ or $(K, Na)(Ta, Nb)O_3$.

When the obtained calcined powder is aggregated, it is preferable to pulverize the calcined powder for a predetermined time by using such as a ball mill to obtain pulverized powder. The starting material of copper or the starting materials of copper and manganese, those weighed at a predetermined ratio, are added to the calcined powder or the pulverized powder, mixing thereof for 5 to 20 hours using a ball mill etc., and the mixed powder of the piezoelectric composition is obtained. The mixing method may be a wet mixing or a dry mixing. In the case of wet mixing, the mixed powder is dried to obtain a mixed powder of the piezoelectric composition.

The method for compacting the mixed powder of the piezoelectric composition is not particularly limited, and may be appropriately selected according to a desired shape, size, etc. When performing pressing, a predetermined binder and, if necessary, additives are added to the mixed powder of the piezoelectric composition, and the mixture is formed into a predetermined shape to obtain a green compact. Further, the green compact may be obtained by using a granulated powder obtained by adding such as a predetermined binder to the mixed powder of the piezoelectric composition and granulating thereof. If necessary, the obtained green compact may be subjected to further pressure treatment by such as CIP.

A binder removal treatment is applied to the obtained green compact. As the binder removal condition, the holding temperature is preferably 400° C. to 800° C., and the temperature holding time is preferably 2 hours to 8 hours.

Subsequently, the green compact after the binder removal treatment is fired. As the firing conditions, the holding temperature is preferably 950° C. to 1060° C., the temperature holding time is preferably 2 hours to 4 hours, the temperature rising and cooling rate is preferably about 50° C./hour to 300° C./hour, the atmosphere is preferably an oxygen-containing atmosphere.

The obtained piezoelectric composition as a sintered body is polished if necessary, an electrode paste is applied and baked to form an electrode. The method for forming the electrodes is not particularly limited, and electrodes may be formed by a vapor deposition, a sputtering, etc.

An electric field of 2 kV/mm to 5 kV/mm is applied to the sintered body, on which the electrode is formed, for about 5 minutes to 1 hour in oil at a predetermined temperature to pole the sintered body. After the poling processing, a piezoelectric composition in which the spontaneous polarization is aligned in a predetermined direction is obtained.

The piezoelectric composition after the poling processing is processed into a predetermined size as necessary to form a plate-shaped piezoelectric part 1. Next, the electrodes 2 and 3 are formed on the piezoelectric part 1 by such as a vapor deposition, whereby the piezoelectric element shown in FIG. 1 is obtained.

3. Effect in the Embodiment

In the embodiment, an alkali metal niobate based compound having the perovskite structure is employed as a complex oxide included as a main component in the piezoelectric composition, and copper (Cu) is further included in the piezoelectric composition within the above range. Since Cu included within the above range is not included in excess with respect to the complex oxide, the secondary phase different from the crystal grains constituting the complex oxide is not likely to form. That is, Cu is in solid solved in the crystal grains constituting the complex oxide, or present in the grain boundaries formed between crystal grains. By having such existing forms of Cu, the binding strength between crystal grains become strong, resulting in an improvement of the mechanical strength of the piezoelectric composition.

The fired piezoelectric composition is sometimes processed, for example, at the time of poling processing, producing a piezoelectric element, etc. If the piezoelectric composition does not have a preferable mechanical strength, problems such as chipping and cracking due to insufficient strength of the piezoelectric composition occur during processing, causing defective products. When such defective products are produced, the yield decreases, and a high productivity cannot be realized. In addition, since mechanical displacement and electrical displacement are repeatedly applied to the piezoelectric composition, it needs to have a strength capable of withstanding these displacements. Since the piezoelectric composition according to the embodiment has a preferable mechanical strength, it has a preferable processability, and it can improve the yield and improve the production efficiency of the piezoelectric element. Furthermore, the piezoelectric composition according to the embodiment has an enough strength to withstand repeatedly applied mechanical displacement and electrical displacement.

Further, Cu has the effect of improving the mechanical quality factor Qm. On the contrary, when the Cu content is increased, there is a problem that the leakage current at the time of poling processing for the piezoelectric composition increases, and the poling processing becomes insufficient, and thus Qm decreases. Therefore, in the embodiment, by controlling "m" of the complex oxide together with the Cu content, the generation of the secondary phases can be suppressed, and the range of the Cu content capable of performing sufficient poling processing can be expanded, and a high Qm can be realized.

Further, while setting the "m" in the specific range, Nb in the composite oxide is partly replaced with Ta in a predetermined ratio. Thereby, while maintaining a preferable mechanical strength, Qm is further improved and the dielectric constant £ can also be improved.

Furthermore, by incorporating manganese (Mn) in addition to Cu as a subcomponent of the complex oxide, the mechanical strength of the piezoelectric composition can be further enhanced, and the yield at the time of poling processing can be improved.

4. Modified Embodiments

In the embodiment described above, the piezoelectric element in which the piezoelectric part is a single layer has been described, but a piezoelectric element having a structure in which piezoelectric parts are laminated may be used. Further, a piezoelectric element having a combination of thereof may be used.

Figure 2:
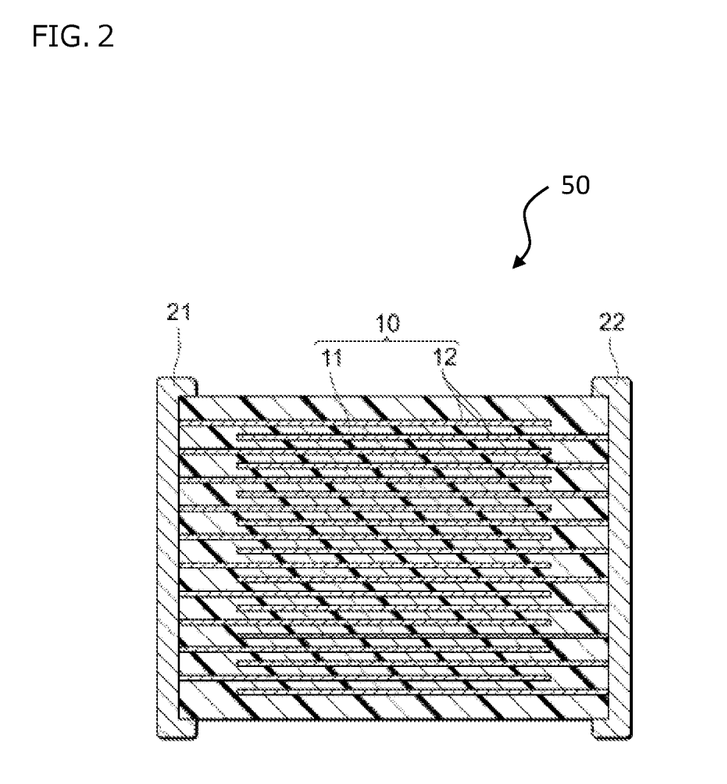
FIG. 2 is a schematic cross sectional view of another example of the piezoelectric element according to the embodiment.

As the piezoelectric element having a structure in which piezoelectric parts are laminated, for example, the piezoelectric element 50 shown in FIG. 2 is exemplified. This piezoelectric element 50 includes a laminate 10 in which multiple piezoelectric layers 11 made of the piezoelectric composition according to the embodiment and multiple internal electrodes 12 are alternately laminated. A pair of terminal electrodes 21 and 22 are formed on both end parts of the laminate 10 to be electrically connected to the internal electrode layers 12 alternately arranged inside the laminate 10.

The thickness per one layer (an interlayer thickness) of the piezoelectric layers 11 is not particularly limited, and can be set arbitrarily according to desired properties, use, etc. Usually, the interlayer thickness is preferably about 1 µm to 100 µm. The number of layers of the piezoelectric layer 11 is not particularly limited, and can be arbitrarily set according to desired properties, use, etc.

As a method of producing the piezoelectric element 50 shown in FIG. 2, a known method may be used. For example, a green chip to be the laminate 10 shown in FIG. 2 is prepared and fired to obtain a laminate 10. Then, terminal electrodes are printed or transferred to the laminate 10 and fired thereof. A general printing method and a sheet method each using paste are exemplified as methods for producing the green chip. In the printing method and the sheet method, a green chip is formed by using a paste prepared by mixing raw material powders of the above described piezoelectric composition and a vehicle in which a binder is dissolved in a solvent and forming a paint.

Although the embodiment of the invention has been described above, the invention is not limited to the above embodiments and modifications may be made in various aspects within a scope of the invention.

EXAMPLE

Hereinafter, the invention will be described in more detail using examples and comparative examples. However, the invention is not limited to the following examples.

Experimental Ex. 1

First, powder of potassium hydrogen carbonate ($KHCO_3$), powder of sodium hydrogen carbonate ($NaHCO_3$), powder of tantalum oxide ($Ta_2O_5$) and powder of niobium oxide ($Nb_2O_5$) were prepared as starting materials for the complex oxide $((K_xNa_{1-x})_m(Ta_yNb_{1-y})O_3)$ which is the main component. Powder of copper oxide (CuO) and powder of manganese oxide ($MnO_2$) were also prepared as starting materials for copper (Cu) and manganese (Mn) included in the piezoelectric composition.

The prepared starting materials were weighed so that the piezoelectric composition after firing (sintered body) had the composition shown in Table 1. Each weighed powder of $KHCO_3$, $NaHCO_3$ and $Nb_2O_5$ were mixed by a ball mill for 16 hours, subsequently dried at 120° C., and obtained mixed powder. The obtained mixed powder was pressed to compact the mixed powder, calcined at 1000° C. for 4 hours, and obtained a calcined body of the complex oxide. Subsequently, the calcined body was pulverized by a ball mill for 16 hours and obtained pulverized powder.

Each weighed powder of CuO and $MnO_2$ was added to the obtained pulverized powder, mixed by a ball mill for 16 hours, subsequently dried at 120° C., and obtained raw material powder of the piezoelectric composition. PVA as a binder was added to the obtained raw material powder of the piezoelectric composition and granulated thereof by a known method. Next, the obtained granulated powder was pressed by a pressing machine under a load of 196 MPa and obtained a plate-shaped green compact.

The plate-shaped green compact thus obtained was subjected to a binder removal treatment at 550° C. for 2 hours. The green compact after the binder removal treatment was fired under air at 1050° C. for 2 hours and obtained a piezoelectric composition (a sintered body).

The obtained sintered body was polished to obtain a parallel plate shape having a thickness of 1.0 mm, silver paste was printed on both sides of the parallel plate shaped sintered body, baked thereof at 800° C. and provided facing electrodes of silver. Finally, an electric field of 3 kV/mm was applied to the sample in silicone oil at 150° C. for 5 minutes to pole the piezoelectric composition, and piezoelectric composition samples (Sample Nos. 1 to 24) were obtained.

The mechanical strength was measured in the following manner for the obtained samples.

The piezoelectric composition (sintered body) was processed into a length of 7.2 mm, a width of 2.5 mm, and a thickness of 0.32 mm using a double-sided lapping machine and a dicing saw to obtain a sample for measuring the mechanical strength. The maximum load (N), when the sample for measuring the mechanical strength was broken by a three-point bending with a distance between supporting points of 5 mm, was measured using 5543 made by INSTRON for each 20 samples. The mechanical strength was then calculated. In the example, in consideration of practical processability, it was determined preferable when a sample has a mechanical strength of 70 MPa or more. The results are shown in Table 1.

TABLE 1

| Sample No. | $(K_xNa_{1-x})_m(Ta_yNb_{1-y})O_3$ | | | Cu n (mol %) | Mn z (mol %) | Mechanical strength (MPa) |
|---|---|---|---|---|---|---|
| | m | x | y | | | |
| 1 | 0.999 | 1.000 | 0.000 | 0.100 | 0.000 | 75 |
| 2 | 0.998 | 1.000 | 0.000 | 0.200 | 0.000 | 115 |
| 3 | 0.996 | 1.000 | 0.000 | 0.400 | 0.000 | 114 |
| 4 | 0.995 | 1.000 | 0.000 | 0.600 | 0.000 | 116 |
| 5 | 0.994 | 1.000 | 0.000 | 0.800 | 0.000 | 116 |
| 6 | 0.994 | 1.000 | 0.000 | 0.900 | 0.000 | 114 |
| 7 | 0.994 | 1.000 | 0.000 | 1.000 | 0.000 | 115 |
| 8 | 0.991 | 1.000 | 0.000 | 1.000 | 0.000 | 116 |
| 9 | 0.983 | 1.000 | 0.000 | 1.000 | 0.000 | 118 |
| 10 | 0.983 | 1.000 | 0.000 | 0.900 | 0.000 | 117 |
| 11 | 0.970 | 1.000 | 0.000 | 1.000 | 0.000 | 78 |
| 12 | 0.970 | 1.000 | 0.000 | 0.900 | 0.000 | 76 |
| 13 | 0.994 | 0.810 | 0.000 | 1.000 | 0.000 | 124 |
| 14 | 0.994 | 0.400 | 0.000 | 1.000 | 0.000 | 124 |
| 15 | 0.994 | 1.000 | 0.000 | 1.000 | 0.300 | 122 |
| 16 | 0.994 | 1.000 | 0.000 | 0.900 | 0.300 | 123 |
| 17 | 0.994 | 1.000 | 0.000 | 0.800 | 0.300 | 122 |
| 18 | 0.994 | 1.000 | 0.000 | 1.000 | 1.000 | 124 |
| 19 | 0.994 | 1.000 | 0.000 | 1.000 | 1.500 | 123 |
| 20 | 1.001 | 1.000 | 0.000 | 1.000 | 0.000 | 90 |
| 21 | 0.969 | 1.000 | 0.000 | 1.000 | 0.000 | 92 |
| 22 | 0.994 | 0.300 | 0.000 | 1.000 | 0.000 | 88 |
| 23* | 0.994 | 1.000 | 0.000 | 0.000 | 0.000 | 65 |
| 24* | 0.994 | 1.000 | 0.000 | 1.100 | 0.000 | 60 |

*in the table indicates a sample which is out of the scope of the invention

From Table 1, it was confirmed that a preferable mechanical strength can be achieved by setting the content of copper with respect to niobate alkali metal based compound within the range.

Then, mechanical quality factor Qm was measured in the following manner for the obtained samples.

Qm was measured by 4194A IMPEDANCE/GAIN-PHASE ANALYZER (made by HEWLETT PACKARD). In this example, it was determined that the sample having a Qm of 1,500 or more was preferable. The results are shown in Table 2.

Note that, "-" indicated in the column of mechanical quality factor Qm in Table 2 shows that the predetermined piezoelectric properties could not be obtained and Qm could not be measured due to an insufficient poling processing of the piezoelectric composition or a generation of the dielectric breakdown during the poling processing.

TABLE 2

| Sample No. | $(K_xNa_{1-x})_m(Ta_yNb_{1-y})O_3$ | | | Component | | Properties | |
|---|---|---|---|---|---|---|---|
| | | | | Cu n | Mn z | Mechanical strength | Mechanical quality |
| | m | x | y | (mol %) | (mol %) | (MPa) | factor Qm |
| 1 | 0.999 | 1.000 | 0.000 | 0.100 | 0.000 | 75 | 350 |
| 2 | 0.998 | 1.000 | 0.000 | 0.200 | 0.000 | 115 | 680 |
| 3 | 0.996 | 1.000 | 0.000 | 0.400 | 0.000 | 114 | 1200 |
| 4 | 0.995 | 1.000 | 0.000 | 0.600 | 0.000 | 116 | 1650 |
| 5 | 0.994 | 1.000 | 0.000 | 0.800 | 0.000 | 116 | 1780 |
| 6 | 0.994 | 1.000 | 0.000 | 0.900 | 0.000 | 114 | 1850 |
| 7 | 0.994 | 1.000 | 0.000 | 1.000 | 0.000 | 115 | 1930 |
| 8 | 0.991 | 1.000 | 0.000 | 1.000 | 0.000 | 116 | 860 |
| 9 | 0.983 | 1.000 | 0.000 | 1.000 | 0.000 | 118 | 410 |
| 10 | 0.983 | 1.000 | 0.000 | 0.900 | 0.000 | 117 | 380 |
| 11 | 0.970 | 1.000 | 0.000 | 1.000 | 0.000 | 78 | 220 |
| 12 | 0.970 | 1.000 | 0.000 | 0.900 | 0.000 | 76 | 210 |
| 13 | 0.994 | 0.810 | 0.000 | 1.000 | 0.000 | 124 | 1600 |
| 14 | 0.994 | 0.400 | 0.000 | 1.000 | 0.000 | 124 | 1200 |
| 15 | 0.994 | 1.000 | 0.000 | 1.000 | 0.300 | 122 | 1750 |
| 16 | 0.994 | 1.000 | 0.000 | 0.900 | 0.300 | 123 | 1680 |
| 17 | 0.994 | 1.000 | 0.000 | 0.800 | 0.300 | 122 | 1550 |
| 18 | 0.994 | 1.000 | 0.000 | 1.000 | 1.000 | 124 | 1470 |
| 19 | 0.994 | 1.000 | 0.000 | 1.000 | 1.500 | 123 | 1320 |
| 23* | 0.994 | 1.000 | 0.000 | 0.000 | 0.000 | 65 | 265 |
| 24* | 0.994 | 1.000 | 0.000 | 1.100 | 0.000 | 60 | — |

*in the table indicates a sample which is out of the scope of the invention

From Table 2, it was confirmed that Qm could be further improved while maintaining a preferable mechanical strength by setting "m" and "x" in the composition formula $(K_xNa_{1-x})_m(Ta_yNb_{1-y})O_3$ within the above ranges.

Experimental Ex. 2

Starting materials were weighed so that the piezoelectric composition after firing (sintered body) had the composition shown in Table 3. Then, in the same manner as in Experimental Ex. 1, a sintered body was produced, and piezoelectric composition samples (Sample Nos. 25 to 39) were obtained.

The mechanical strength and the mechanical quality factor Qm of the obtained samples were measured in the same manner as in Experimental Ex. 1, and the dielectric constant c thereof were measured as follows.

Figure 3:
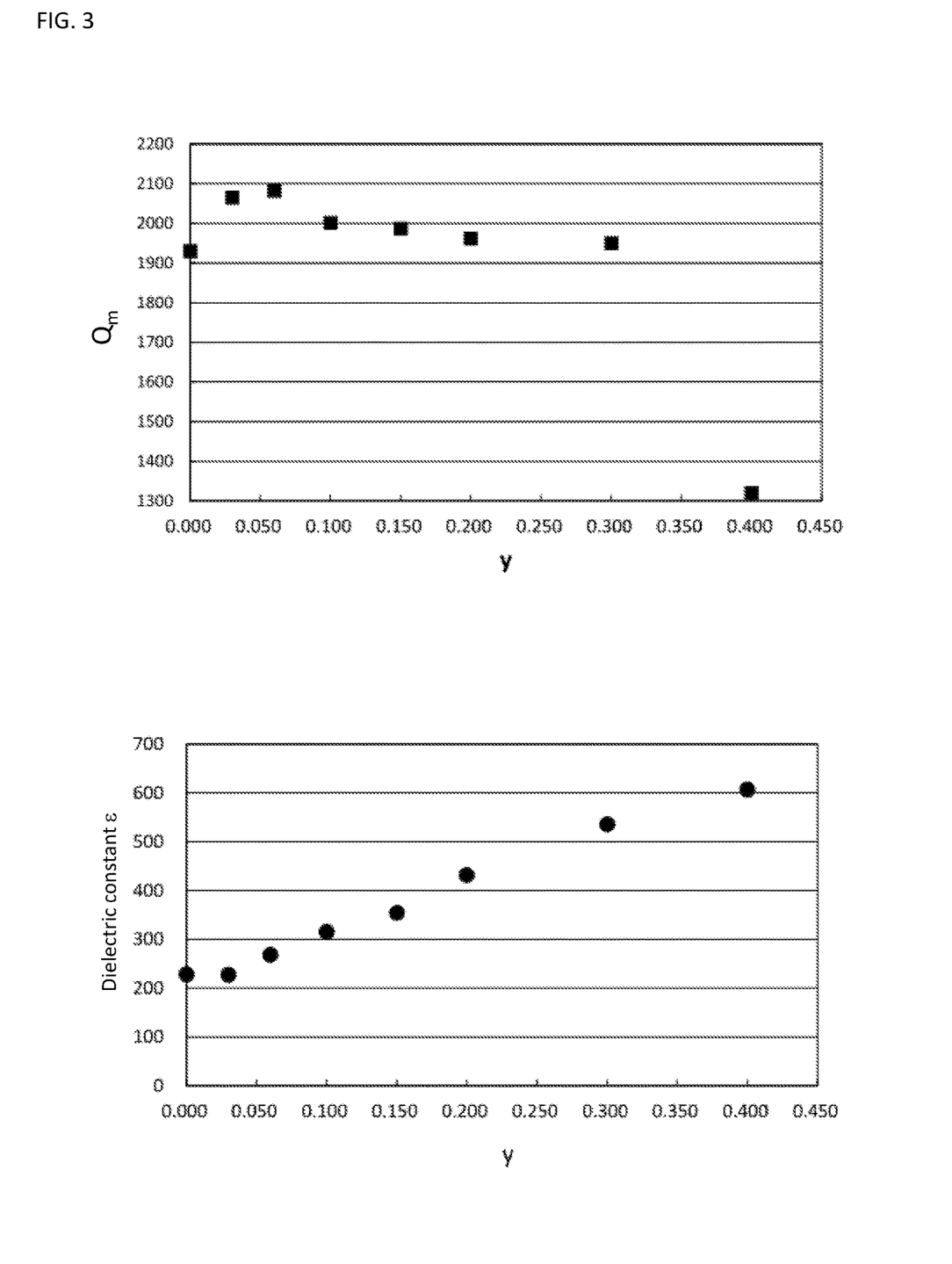
FIG. 3 is a graph showing the relationships between "y" and Qm, and "y" and dielectric constant £ according to samples of the example.

First, capacitance was measured by inputting a signal with a frequency of 1 kHz and an input signal level (measurement voltage) of 1 Vrms by a digital LCR meter (4284A made by YHP) at room temperature (20° C.). Then, the dielectric constant c was calculated based on the thickness of the piezoelectric composition, the electrode area, and the capacitance obtained by the measurement. The dielectric constant c was also measured for the Sample Nos. 1 and 7. The results are shown in Table 3. Further, the relationships between "y" and Qm, and "y" and dielectric constant c is shown in FIG. 3 for the Sample Nos. 7, 25 to 28, 31, 32 and 39.

TABLE 3

| Sample No. | $(K_xNa_{1-x})_m(Ta_yNb_{1-y})O_3$ | | | Component | | Properties | | |
|---|---|---|---|---|---|---|---|---|
| | | | | Cu n | Mn z | Mechanical strength | Mechanical quality | Dielectric constant |
| | m | x | y | (mol %) | (mol %) | (MPa) | factor Qm | ε |
| 25 | 0.994 | 1.000 | 0.030 | 1.000 | 0.000 | 108 | 2065 | 227 |
| 26 | 0.994 | 1.000 | 0.060 | 1.000 | 0.000 | 112 | 2082 | 268 |
| 27 | 0.994 | 1.000 | 0.100 | 1.000 | 0.000 | 119 | 2001 | 315 |
| 28 | 0.994 | 1.000 | 0.150 | 1.000 | 0.000 | 121 | 1987 | 354 |
| 29 | 0.996 | 0.400 | 0.100 | 1.000 | 0.000 | 126 | 1427 | 403 |
| 30 | 0.999 | 1.000 | 0.100 | 0.100 | 0.000 | 78 | 421 | 467 |
| 31 | 0.994 | 1.000 | 0.200 | 1.000 | 0.000 | 123 | 1962 | 432 |
| 32 | 0.994 | 1.000 | 0.300 | 1.000 | 0.000 | 127 | 1950 | 536 |
| 33 | 0.991 | 1.000 | 0.200 | 1.000 | 0.000 | 118 | 1321 | 455 |
| 34 | 0.970 | 1.000 | 0.200 | 1.000 | 0.000 | 80 | 398 | 408 |
| 35 | 0.994 | 1.000 | 0.060 | 1.000 | 0.300 | 126 | 2078 | 283 |
| 36 | 0.994 | 1.000 | 0.060 | 1.000 | 1.500 | 125 | 1731 | 410 |
| 37* | 0.994 | 1.000 | 0.100 | 0.000 | 0.000 | 66 | 265 | 430 |
| 38* | 0.994 | 1.000 | 0.100 | 1.100 | 0.000 | 62 | — | — |
| 7 | 0.994 | 1.000 | 0.000 | 1.000 | 0.000 | 115 | 1930 | 228 |
| 39 | 0.994 | 1.000 | 0.400 | 1.000 | 0.000 | 128 | 1320 | 607 |
| 1 | 0.999 | 1.000 | 0.000 | 0.100 | 0.000 | 75 | 350 | 432 |

*in the table indicates a sample which is out of the scope of the invention

From Table 3 and FIG. 3, it was confirmed that Qm and dielectric constant c could be further improved while maintaining a preferable mechanical strength by setting "y" in the composition formula $(K_xNa_{1-x})_m(Ta_yNb_{1-y})O_3$ within the above ranges.

Since the piezoelectric composition according to the invention has a high mechanical strength, it can be suitably used for piezoelectric elements in various fields.

DESCRIPTION OF REFERENCE NUMERAL

5 . . . Piezoelectric element
1 . . . Piezoelectric part
2, 3 . . . Electrodes
50 . . . Piezoelectric element
10 . . . Multilayer body
11 . . . Piezoelectric layer
12 . . . Internal electrode layer
21, 22 . . . terminal electrodes

What is claimed is:

1. A piezoelectric composition comprising copper, manganese and a complex oxide having a perovskite structure represented by a general formula $ABO_3$, wherein
an A site element in the $ABO_3$ is potassium or potassium and sodium,
a B site element in the $ABO_3$ is niobium or niobium and tantalum,
the copper is included in n mol % in terms of a copper element with respect to 1 mol of the complex oxide, and
n satisfies $0.100 \leq n \leq 1.000$, and
the manganese is included in z mol % in terms of a manganese element with respect to 1 mol of the complex oxide, and
z satisfies $0.000 < z \leq 1.500$.

2. The piezoelectric composition according to claim 1, wherein
m satisfies $0.970 \leq m \leq 0.999$
when m is the total number of atoms of the A site elements with respect to the total number of atoms of the B site element in the $ABO_3$.

3. The piezoelectric composition according to claim 2, wherein
m in the compositional formula satisfies $0.991 \leq m \leq 0.999$.

4. The piezoelectric composition according to claim 1, wherein
the $ABO_3$ is represented by a compositional formula $(K_xNa_{1-x})_m(Ta_yNb_{i-y})O_3$,
x in the compositional formula satisfies $0.000 < x \leq 1.000$,
m in the compositional formula satisfies $0.969 \leq m \leq 1.001$, and
y in the compositional formula satisfies $0 < y \leq 0.300$.

5. The piezoelectric composition according to claim 4, wherein $0.810 \leq x \leq 1.000$.

6. The piezoelectric composition according to claim 4, wherein $0.030 \leq y \leq 0.100$.

7. The piezoelectric composition according to claim 1, wherein
the $ABO_3$ is represented by a compositional formula $(K_xNa_{1-x})_m(Ta_yNb_{i-y})O_3$, and
x in the compositional formula satisfies $0.400 \leq x \leq 1.000$,
m in the compositional formula satisfies $0.969 \leq m \leq 1.001$, and
y in the compositional formula satisfies $0 \leq y < 1.000$.

8. The piezoelectric composition according to claim 7, wherein $0.810 \leq x \leq 1.000$.

9. The piezoelectric composition according to claim 7, wherein $0.030 \leq y \leq 0.100$.

10. The piezoelectric composition according to claim 1, wherein n satisfies $0.200 \leq n \leq 1.000$.

11. The piezoelectric composition according to claim 1, wherein n satisfies $0.600 \leq n \leq 1.000$.

12. The piezoelectric composition according to claim 1, wherein z satisfies $0.000 < z \leq 0.300$.

13. The piezoelectric composition according to claim 1, which has an average crystal grain size of crystal grains of 0.5 μm to 20 μm.

14. A piezoelectric element including the piezoelectric composition according to claim 1.

* * * * *